(12) United States Patent
Pan et al.

(10) Patent No.: US 7,915,941 B1
(45) Date of Patent: Mar. 29, 2011

(54) PHASE INTERPOLATOR CIRCUITS AND METHODS

(75) Inventors: Mingde Pan, Morgan Hill, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 2 days.

(21) Appl. No.: 12/496,387

(22) Filed: Jul. 1, 2009

(51) Int. Cl.
*H03H 11/16* (2006.01)

(52) U.S. Cl. .................................. 327/231; 327/355
(58) Field of Classification Search .................. None
See application file for complete search history.

(56) References Cited

U.S. PATENT DOCUMENTS

| | | | | |
|---|---|---|---|---|
| 5,831,484 | A * | 11/1998 | Lukes et al. | 331/17 |
| 6,111,445 | A | 8/2000 | Zerbe et al. | |
| 6,198,780 | B1 * | 3/2001 | Kang | 375/321 |
| 6,366,148 | B1 * | 4/2002 | Kim | 327/262 |
| 6,775,344 | B1 * | 8/2004 | Buhler et al. | 375/376 |
| 7,166,995 | B2 * | 1/2007 | Huang et al. | 324/142 |
| 7,409,012 | B2 | 8/2008 | Martin et al. | |
| 7,532,053 | B2 | 5/2009 | Rausch | |
| 7,595,687 | B2 * | 9/2009 | Mortensen et al. | 327/551 |
| 2007/0247196 | A1 * | 10/2007 | Niedermeier et al. | 326/95 |

OTHER PUBLICATIONS

Muneo Fukaishi, et al., "A 20-Gb/s CMOS Multichannel Transmitter and Receiver Chip Set for Ultra-High-Resolution Digital Displays," IEEE Journal of Solid-State Circuits, vol. 35, No. 11, Nov. 2000, pp. 1611-1618.

Rainer Kreienkamp, et al., "A 10-Gb/s CMOS Clock and Data Recovery Circuit With an Analog Phase Interpolator," IEEE Journal of Solid-State Circuits, vol. 40, No. 3, Mar. 2005, pp. 736-743.

Stefanos Sidiropoulos, et al., "A Semidigital Dual Delay-Locked Loop," IEEE Journal of Solid-State Circuits, vol. 32, No. 11, Nov. 1997, pp. 1683-1692.

Kostas Pagiamtzis, "ECE1352 Analog Integrated Circuits Reading Assignment: Phase Interpolating Circuits," Nov. 12, 2001, pp. 1-19.

* cited by examiner

*Primary Examiner* — Cassandra Cox
(74) *Attorney, Agent, or Firm* — Steven J. Cahill (57) ABSTRACT

A phase interpolator circuit includes first and second low pass filter circuits and a multiplier circuit. The first low pass filter circuit increases a common mode voltage of a clock signal to generate a first varying signal. The second low pass filter circuit increases a common mode voltage of a clock signal to generate a second varying signal. The first low pass filter circuit can include a first variable capacitance, and the second low pass filter circuit can include a second variable capacitance. The multiplier circuit has a first input coupled to the first low pass filter circuit and a second input coupled to the second low pass filter circuit. The multiplier circuit generates a third varying signal in response to the first and the second varying signals. The phase interpolator circuit generates a phase shift in the third varying signal.

19 Claims, 7 Drawing Sheets

PHASE INTERPOLATOR CIRCUITS AND METHODS

BACKGROUND OF THE INVENTION

The present invention relates to electronic circuits, and more particularly, to phase interpolator circuits and methods.

A digital periodic clock signal is often used to sample a data signal that is transmitted to an integrated circuit from an external source. Different techniques can be used to align the rising and falling edges of the clock signal with respect to a sampling window of the data signal so that the data signal can be sampled accurately. As the clock signal frequency and the data rate increases, the sampling window decreases, and the sampling timing is more constrained.

BRIEF SUMMARY OF THE INVENTION

In an embodiment, a phase interpolator circuit includes first and second low pass filter circuits and a multiplier circuit. The first low pass filter circuit increases a common mode voltage of a clock signal to generate a first varying signal. The second low pass filter circuit increases a common mode voltage of a clock signal to generate a second varying signal. The multiplier circuit has a first input coupled to the first low pass filter circuit and a second input coupled to the second low pass filter circuit. The multiplier circuit generates a third varying signal in response to the first and the second varying signals.

In another embodiment, a phase interpolator circuit also includes first and second low pass filter circuits and a multiplier circuit. The first low pass filter circuit includes a first variable capacitance and generates a first varying signal based on a clock signal. The second low pass filter circuit includes a second variable capacitance and generates a second varying signal based on a clock signal. The multiplier circuit has a first input coupled to the first low pass filter circuit and a second input coupled to the second low pass filter circuit. The multiplier generates a third varying signal in response to the first and the second varying signals. The phase interpolator circuit generates a phase shift in the third varying signal.

Various objects, features, and advantages of the present invention will become apparent upon consideration of the following detailed description and the accompanying drawings.

DETAILED DESCRIPTION OF THE INVENTION

Figure 1:
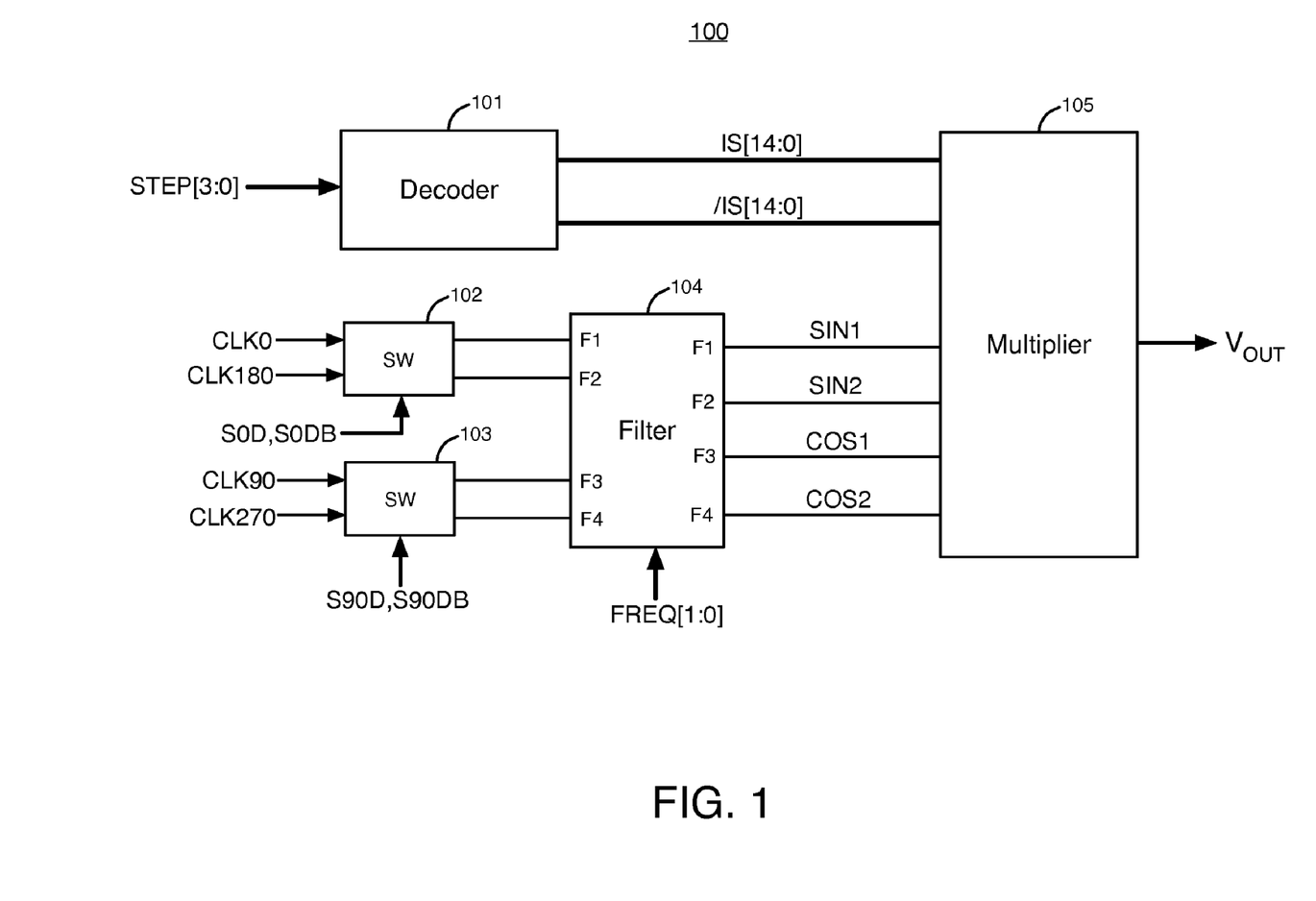
FIG. 1 is a block diagram that illustrates an example of a phase interpolator, according to an embodiment of the present invention.

FIG. 1 is a block diagram that illustrates an example of a phase interpolator 100, according to an embodiment of the present invention. Phase interpolator 100 receives four input digital periodic clock signals CLK0, CLK90, CLK180, and CLK270. Each of the clock signals CLK0, CLK90, CLK180, and CLK270 is a voltage square wave that has a 50% duty cycle. Clock signals CLK0, CLK90, CLK180, and CLK270 are offset in phase at 90° phase intervals. Clock signals CLK0, CLK90, CLK180, and CLK270 have relative phases of 0°, 90°, 180°, and 270°. These clock signals can be generated, for example, by a voltage-controlled oscillator in a phase-locked loop.

Phase interpolator 100 converts clock signals CLK0, CLK90, CLK180, and CLK270 into four sinusoidal voltage waveforms having relative phases of 0°, 90°, 180°, and 270°. Phase interpolator 100 uses these four sinusoidal voltage waveforms to generate a sinusoidal output voltage signal waveform $V_{OUT}$ that has a selected phase shift relative to clock signal CLK0. The phase shift of $V_{OUT}$ relative to CLK0 can be selected to be any one of 64 different phase shifts. The 64 different phase shifts for $V_{OUT}$ are between 0° and 360° relative to the phase of CLK0.

Phase interpolator 100 includes decoder 101, switch blocks 102-103, filter block 104, and multiplier 105. Decoder 101 decodes 4 digital input signals STEP[3:0] to generate the logic states of 15 decoded digital signals IS[14:0]. Decoder 101 generates an additional 15 decoded digital signals /IS[14:0]. The 15 signals /IS[14:0] are the logical inverse of the 15 signals IS[14:0], respectively. Signals IS[14:0] and /IS[14:0] are current control signals that are used to control the current in multiplier 105.

Switch block 102 receives voltage square wave clock signals CLK0 and CLK180 at its inputs, and switch block 103 receives voltage square wave clock signals CLK90 and CLK270 at its inputs. Switch block 102 receives digital switch control signals S0D and S0DB, and switch block 103 receives digital switch control signals S90D and S90DB. Signal S0DB is the logical inverse of signal S0D, and signal S90DB is the logical inverse of signal S90D.

Switch block 102 couples clock signals CLK0 and CLK180 to inputs of filters F1 and F2 in filter block 104 based on the logic states of switch control signals S0D and S0DB. Switch block 103 couples clock signals CLK90 and CLK270 to inputs of filters F3 and F4 in filter block 104 based on the logic states of switch control signals S90D and S90DB.

Filters F1-F4 in filter block 104 convert clock signals CLK0, CLK90, CLK180, and CLK270 into four sinusoidal voltage waveform signals. Filter F1 generates a first sine voltage waveform SIN 1, filter F2 generates a second sine voltage waveform SIN 2, filter F3 generates a first cosine voltage waveform COS 1, and filter F4 generates a second cosine voltage waveform COS 2. The four sinusoidal waveform signals SIN 1, SIN 2, COS 1, and COS 2 are transmitted to inputs of multiplier circuit 105.

Multiplier circuit 105 generates a sinusoidal output voltage waveform signal $V_{OUT}$ in response to sinusoidal voltage waveform signals SIN 1, SIN 2, COS 1, and COS 2. Multiplier circuit 105 can be configured to shift the phase of output voltage $V_{OUT}$ relative to the phase of CLK0. Sinusoidal signal $V_{OUT}$ can be converted into a digital voltage square wave that represents a phase shifted clock signal using, e.g., a buffer circuit (not shown).

The phase shifted clock signal can be used for a variety of purposes. For example, the phase shifted clock signal can be used as a sampling clock signal to sample an input data signal. Phase interpolator 100 can shift the phase of the sampling clock signal so that each rising and falling edge of the sampling clock signal occurs, for example, near the center of a sampling window in the input data signal.

The logic states of switch control signals S0D, S0DB, S90D, and S90DB and current control signals IS[14:0] and /IS[14:0] determine the phase shift of $V_{OUT}$ relative to the phase of CLK0. The logic states of switch control signals S0D, S0DB, S90D, and S90DB and the logic states of digital input signals STEP[3:0] can be changed to adjust the phase shift of $V_{OUT}$ relative to the phase of CLK0. Decoder 101 changes the logic states of signals IS[14:0] and /IS[14:0] based on changes in the logic states of signals STEP[3:0]. Decoder 101 causes the number of 1 bits in IS[14:0] and the number of 0 bits in /IS[14:0] to equal the binary value of signals STEP[3:0].

Figure 2:
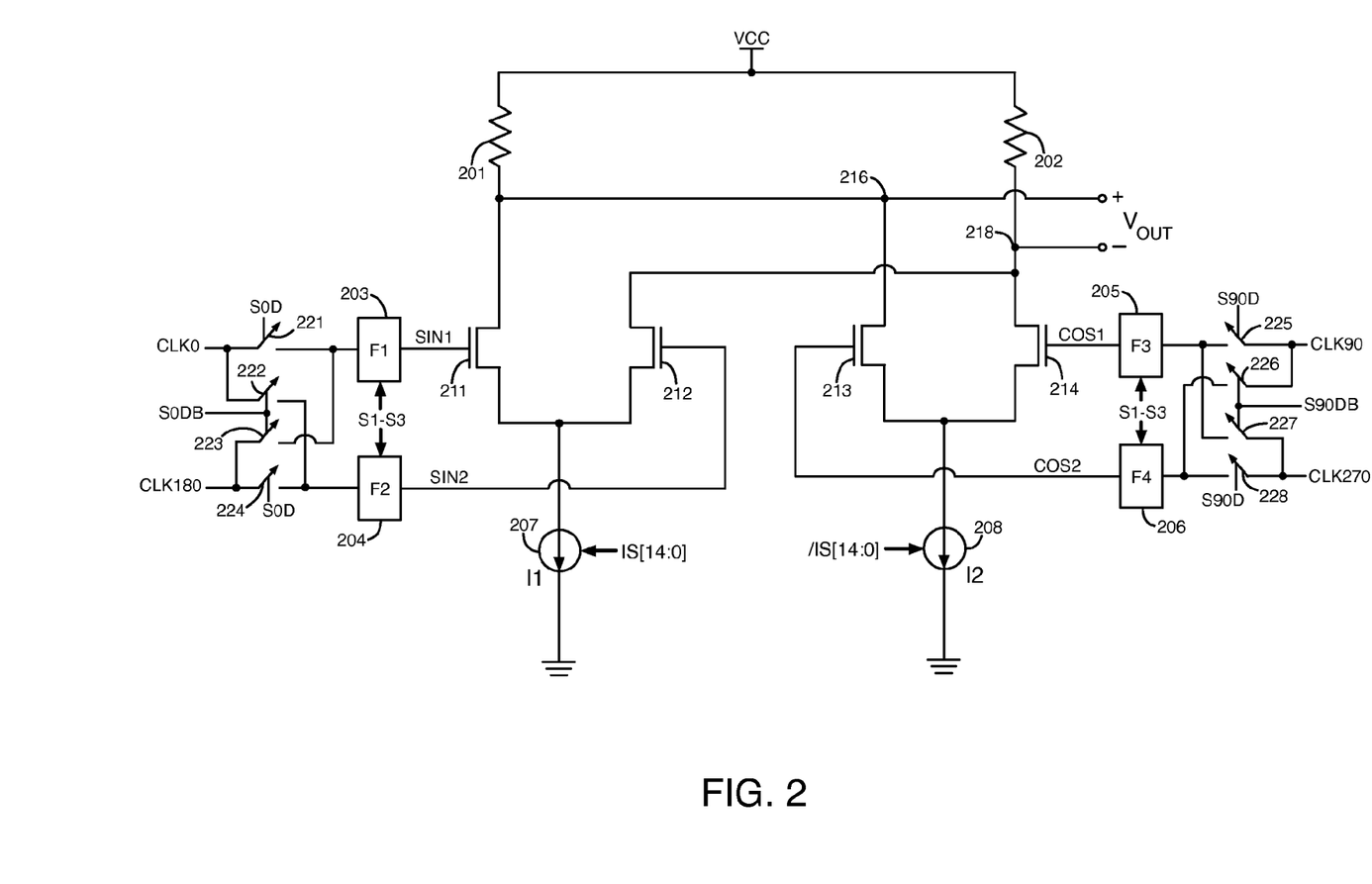
FIG. 2 is a more detailed diagram that illustrates portions of the phase interpolator shown in FIG. 1, according to an embodiment of the present invention.

FIG. 2 is a more detailed diagram that illustrates portions of the phase interpolator 100 shown in FIG. 1, according to an embodiment of the present invention. FIG. 2 illustrates more details of switch blocks 102-103, filter block 104, and multiplier block 105. Decoder 101 is not shown in FIG. 2.

Referring to FIG. 2, switch block 102 includes switch circuits 221-224, and switch block 103 includes switch circuits 225-228. Filter block 104 includes filter circuit F1 203, filter circuit F2 204, filter circuit F3 205, and filter circuit F4 206. Multiplier block 105 includes load resistors 201-202, n-channel metal oxide semiconductor field-effect transistors (MOSFETs) 211-214, and variable current sources 207-208.

Switch control signal S0D controls the conductive states of switches 221 and 224. Switch control signal S0DB controls the conductive states of switches 222 and 223. Switch control signal S90D controls the conductive states of switches 225 and 228. Switch control signal S90DB controls the conductive states of switches 226 and 227.

Switch control signal S0DB is the logical inverse of switch control signal S0D. When switch control signal S0D is in a logic high state, and switch control signal S0DB is in a logic low state, switches 221 and 224 are closed, switches 222 and 223 are open, clock signal CLK0 is transmitted to the input of filter F1 203, and clock signal CLK180 is transmitted to the input of filter F2 204. When switch control signal S0D is in a logic low state, and switch control signal S0DB is in a logic high state, switches 221 and 224 are open, switches 222 and 223 are closed, clock signal CLK0 is transmitted to the input of filter F2 204, and clock signal CLK180 is transmitted to the input of filter F1 203.

Switch control signal S90DB is the logic inverse of switch control signal S90D. When switch control signal S90D is in a logic high state, and switch control signal S90DB is in a logic low state, switches 225 and 228 are closed, switches 226 and 227 are open, clock signal CLK90 is transmitted to the input of filter F3 205, and clock signal CLK270 is transmitted to the input of filter F4 206. When switch control signal S90D is in a logic low state, and switch control signal S90DB is in a logic high state, switches 225 and 228 are open, switches 226 and 227 are closed, clock signal CLK90 is transmitted to the input of filter F4 206, and clock signal CLK270 is transmitted to the input of filter F3 205.

Each of the filter circuits 203-206 can shift the common mode voltage of its input clock signal to generate a sinusoidal output signal. Each of filters circuits 203-206 can also vary the bandwidth of its sinusoidal output signal by varying the capacitance at the output node of each filter. As a result, filter circuits 203-206 provide tolerance to the input clock signal waveform. Further details of filter circuits 203-206 are described below with respect to FIG. 3.

Figure 3:
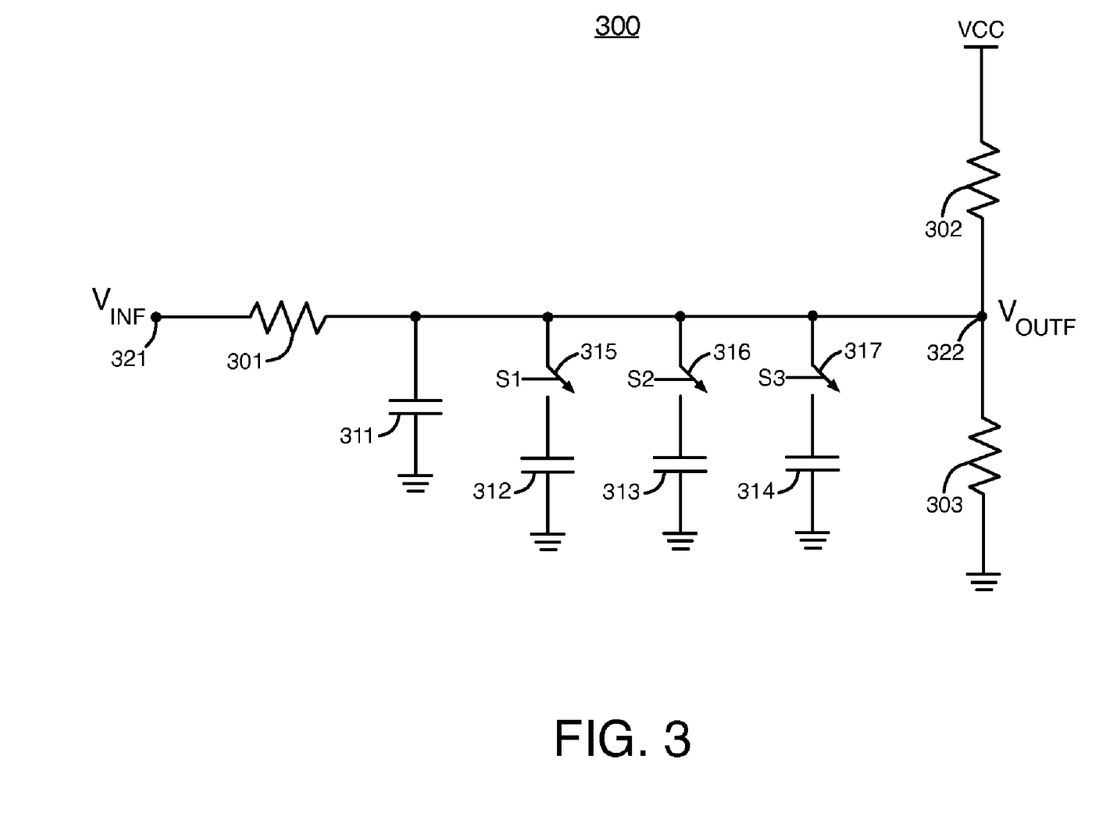
FIG. 3 is a diagram that illustrates an example of a filter circuit used in the phase interpolator of FIGS. 1 and 2, according to an embodiment of the present invention.

FIG. 3 is a diagram that illustrates an example of a filter circuit 300 used in the phase interpolator of FIGS. 1 and 2, according to an embodiment of the present invention. Filter circuit 300 shown in FIG. 3 is an example of a circuit design that can be used to implement each of filters 203-206 shown in FIG. 2. Thus, each of the filter circuits 203-206 shown in FIG. 2 can have the circuitry shown in FIG. 3. Filter circuit 300 includes resistors 301-303, capacitors 311-314, and switches 315-317.

Filter circuits 203-206 convert the square shaped input voltage waveforms CLK0, CLK90, CLK180, and CLK270 into sinusoidal output voltage waveforms SIN 1, SIN 2, COS 1, and COS 2. Filters 203-206 filter out the harmonics in the square shaped input voltage waveforms CLK0, CLK90, CLK180, and CLK270 to generate the sinusoidal output voltage waveforms. Filter circuit 300 is a low pass filter circuit that removes the harmonics in the square shaped clock signal input voltage $V_{INF}$ at input node 321 to generate a sinusoidal output voltage waveform $V_{OUTF}$ at output node 322.

The input voltage $V_{INF}$ at input node 321 is a voltage square wave with full rail-to-rail swing. When the input voltage $V_{INF}$ is at supply voltage VCC, resistors 301 and 302 are coupled in parallel with each other, and the output voltage $V_{OUTF}$ is at its maximum voltage $V_{OUTF(MAX)}$ as defined by equation (1) below. When the input voltage $V_{INF}$ is at the ground voltage, resistors 301 and 303 are coupled in parallel with each other, and the output voltage $V_{OUTF}$ is at its minimum voltage $V_{OUTF(MIN)}$ as defined by equation (2) below.

$$V_{OUTF(MAX)} = VCC \frac{R_3}{R_3 + (R_1 \| R_2)} = VCM + VX \quad (1)$$

$$V_{OUTF(MIN)} = VCC \frac{R_1 \| R_3}{R_2 + (R_1 \| R_3)} = VCM - VX \quad (2)$$

In general, $V_{OUTF}$ is a linear function of $V_{INF}$, as shown in equation (3) below.

$$V_{OUTF} \times (1/R_1 + 1/R_2 + 1/R_3) = V_{INF}/R_1 + VCC/R_2 \quad (3)$$

In equations (1)-(3), $R_1$ is the resistance of resistor 301, $R_2$ is the resistance of resistor 302, $R_3$ is the resistance of resistor 303, and VCM is the common mode voltage of output voltage signal $V_{OUTF}$. $V_{OUTF}$ varies by a voltage of VX in response to the maximum and minimum voltages of $V_{INF}$.

Each of the filters 203-206 is a filter and an analog level-shifter. The common mode voltage VCM of $V_{OUTF}$ for each filter can be set to any voltage between 0 and VCC, by selecting appropriate resistances for resistors 301-303, to fit the input stage of multiplier 105. The resistances of resistors 301-303 can be selected so that filters 203-206 increase the common mode voltages of the sinusoidal output waveform signals SIN 1, SIN 2, COS 1, and COS 2 relative to the common mode voltages of the input waveform signals CLK0, CLK180, CLK90, and CLK270. For example, filters 203-206 can increase the common mode voltages of signals SIN 1, SIN 2, COS 1, and COS 2 to create enough voltage drop to turn on one of transistors 211-212, to turn on one of transistors 213-214, and to provide enough remaining voltage drop across current sources 207-208.

Filter 300 can increase the common mode voltage of $V_{OUTF}$ relative to the common mode voltage of input voltage signal $V_{INF}$. For example, if VCC equals 1.1 volts, $R_1$ equals 3.5 kiloohms, $R_2$ equals 1.75 kiloohms, $R_3$ equals 5.3 kiloohms, then $V_{OUTF(MAX)}$ equals 0.9 volts, $V_{OUTF(MIN)}$ equals 0.6 volts, VCM equals 0.75 volts, and VX equals 0.15 volts. In this example, the common mode voltage of $V_{INF}$ is 0.55 volts. Thus, filter 300 increases the common mode voltage of $V_{OUTF}$ by 0.2 volts relative to the common mode voltage of $V_{INF}$, in this example. If the threshold voltages of transistors 211-214 are, for example, 0.5 volts, signals SIN 1, SIN 2, COS 1, and COS 2 create enough voltage drop to turn on one of transistors 211-212, to turn on one of transistors 213-214, and to provide enough remaining voltage drop to keep current sources 207-208 in the saturation region. The example values are provided for the purpose of illustration and are not intended to limit the scope of the present invention.

Capacitor 311 and switches 315-317 are coupled to output node 322. Capacitors 312-314 are coupled to switches 315-317, respectively. The conductive states of switches 315-317 are controlled by control signals S1, S2, and S3, respectively. When one of control signals S1-S3 is in a logic low state, the switch 315-317 controlled by the respective control signal is conductive (i.e., closed). When one of control signals S1-S3 is in a logic high state, the switch 315-317 controlled by the respective control signal is non-conductive (i.e., open). Filter block 104 includes a decoder that decodes signals FREQ[1:0] to generate control signals S1-S3. Thus, the logic states of control signals S1-S3 are generated based on the logic states of signals FREQ[1:0].

Closing one or more of the switches 315-317 that are opened increases the total capacitance at output node 322. Opening one or more of the switches 315-317 that are closed decreases the total capacitance at output node 322.

The total capacitance at output node 322 determines the bandwidth of filter 300. The bandwidth of filter 300 is based on the cutoff frequency of the RC low pass filter. The total capacitance at output node 322 can be increased to decrease the bandwidth of filter 300, and the total capacitance at output node 322 can be decreased to increase the bandwidth of filter 300. In an alternative embodiment, capacitors 311-314 and switches 315-317 are replaced with a varactor having a variable capacitance that is varied to change the bandwidth of the low pass filter.

Each of capacitors 311-314 can have the same capacitance or a different capacitance. For example, the capacitances of capacitors 311-314 can be 9 femtofarads (fF), 144 fF, 18 fF, and 9 fF, respectively. Table 1 below shows example values for signals FREQ[1:0], signals S1-S3, the bandwidth of filter 300 in Gigabits per second (Gbps), and the total capacitance at output node 322 in fF.

TABLE 1

| FREQ[1:0] | S1 | S2 | S3 | Bandwidth (Gbps) | Total Capacitance (fF) |
| --- | --- | --- | --- | --- | --- |
| 00 | 0 | 0 | 0 | 0.5 | 180 |
| 01 | 1 | 0 | 0 | 2.5 | 36 |
| 10 | 1 | 1 | 0 | 5 | 18 |
| 11 | 1 | 1 | 1 | 10 | 9 |

Referring again to FIG. 2, the sinusoidal output voltages SIN 1, SIN 2, COS 1, and COS 2 of filters 203-206 are provided to the gate terminals of n-channel transistors 211, 212, 214, and 213, respectively. SIN 1=−SIN 2, and COS 1=−COS 2. When SIN 1 is at its maximum voltage, and SIN 2 is at its minimum voltage, transistor 211 is on, transistor 212 is off, and the current I1 through current source 207 flows through transistor 211 and resistor 201. When SIN 1 is at its minimum voltage, and SIN 2 is at its maximum voltage, transistor 211 is off, transistor 212 is on, and the current I1 through current source 207 flows through transistor 212 and resistor 202.

When COS 1 is at its maximum voltage, and COS 2 is at its minimum voltage, transistor 214 is on, transistor 213 is off, and the current I2 through current source 208 flows through transistor 214 and resistor 202. When COS 1 is at its minimum voltage, and COS 2 is at its maximum voltage, transistor 214 is off, transistor 213 is on, and the current I2 through current source 208 flows through transistor 213 and resistor 201.

The current through resistor 201 equals the current through transistor 211 plus the current through transistor 213. The current through resistor 202 equals the current through transistor 212 plus the current through transistor 214. The output voltage $V_{OUT}$ of multiplier 105 and phase interpolator 100 is the voltage across output nodes 216 and 218.

Figure 4:
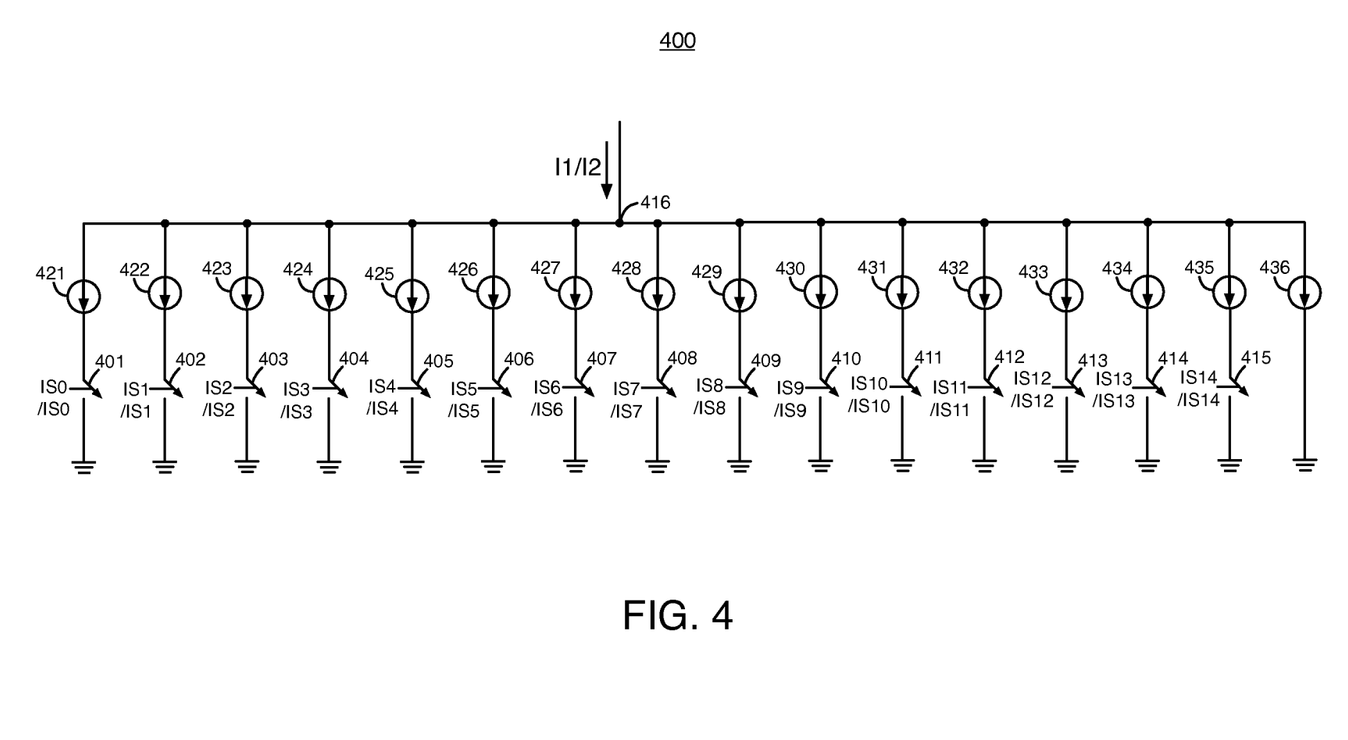
FIG. 4 is a diagram that illustrates an example of a variable current source that can be used to implement each of the variable current sources shown in FIG. 2, according to an embodiment of the present invention.

FIG. 4 is a diagram that illustrates an example of a variable current source 400 that can be used to implement each of the variable current sources 207-208 shown in FIG. 2, according to an embodiment of the present invention. In one embodiment, each of the variable current sources 207 and 208 has the circuit design of variable current source 400 shown in FIG. 4.

Variable current source 400 includes 15 switches 401-415 and 16 constant current sources 421-436. Each of the first 15 current sources 421-435 is coupled in series with a respective one of switches 401-415. In one embodiment, each of the 15 current sources 421-435 supplies the same amount of current between node 416 and ground when the switch coupled to that current source is closed. In variable current source 207, control signals IS0-IS14 control the conductive states of switches 401-415, respectively. In variable current source 208, control signals /IS0-/IS14 control the conductive states of switches 401-415, respectively. Current source 436 provides a minimum current between node 416 and ground when all of switches 401-415 are open. Current source 436 conducts half the current of each of current sources 421-435.

The total current through variable current source 207/400 is referred to as I1, and the total current through variable current source 208/400 is referred to as I2. The total current through variable current source 400 equals the sum of the currents through the current sources 421-435 that are coupled to closed switches and the current through current source 436. For example, if switches 401-408 are closed and switches 409-415 are open, the current through variable current source 400 equals the sum of the currents through current sources 421-428 and 436.

More of the switches 401-415 that are open can be closed to increase the current I1/I2 through variable current source 400. More of the switches 401-415 that are closed can be opened to decrease the current I1/I2 through variable current source 400. Thus, the current I1 through variable current source 207 can be increased or decreased by changing the conductive states of the switches 401-415 in variable current source 207. Also, the current I2 through variable current source 208 can be increased or decreased by changing the conductive states of the switches 401-415 in variable current source 208.

Each of the switches 401-415 conducts current when the logic state of the corresponding control signal IS0-IS14 or /IS0-/IS14, respectively, controlling that switch is in a logic high state (i.e., a 1 bit). Each of the switches 401-415 blocks current flow through the switch when the logic state of the corresponding control signal IS0-IS14 or /IS0-/IS14, respectively, controlling that switch is in a logic low state (i.e., a 0 bit). The logic states of the STEP[3:0] signals determine the logic states of the IS0-IS14 and /IS0-/IS14 signals.

Signals /IS0-/IS14 have complementary bit values relative to signals IS0-IS14, respectively. For example, if signals IS0-IS14 are 000000111111111, then signals /IS0-/IS14 are 111111000000000. When the current through current source 207 is increased by an incremental amount of current, the current through current source 208 is decreased by the same amount of current. When the current through current source 208 is increased by an incremental amount of current, the current through current source 207 is decreased by the same amount of current. The sum of the currents I1 and I2 through current sources 207 and 208 always equals a constant current value $I_{CON}$. Thus, $I1+I2=I_{CON}$. Because the sum of the currents I1 and I2 through current sources 207 and 208 always remains constant, phase interpolator 100 is a monotonic phase interpolator.

The logic states of signals S0D, S0DB, S90D, S90DB, and STEP[3:0] can be changed to vary the phase shift of sinusoidal voltage signal $V_{OUT}$ relative to the phase of input clock signal CLK0. The logic states of signals S0D, S0DB, S90D, S90DB, and STEP[3:0] can be selected to generate any one of 64 different phase shifts in $V_{OUT}$ that are between 0° and 360° relative to CLK0.

Figure 5:
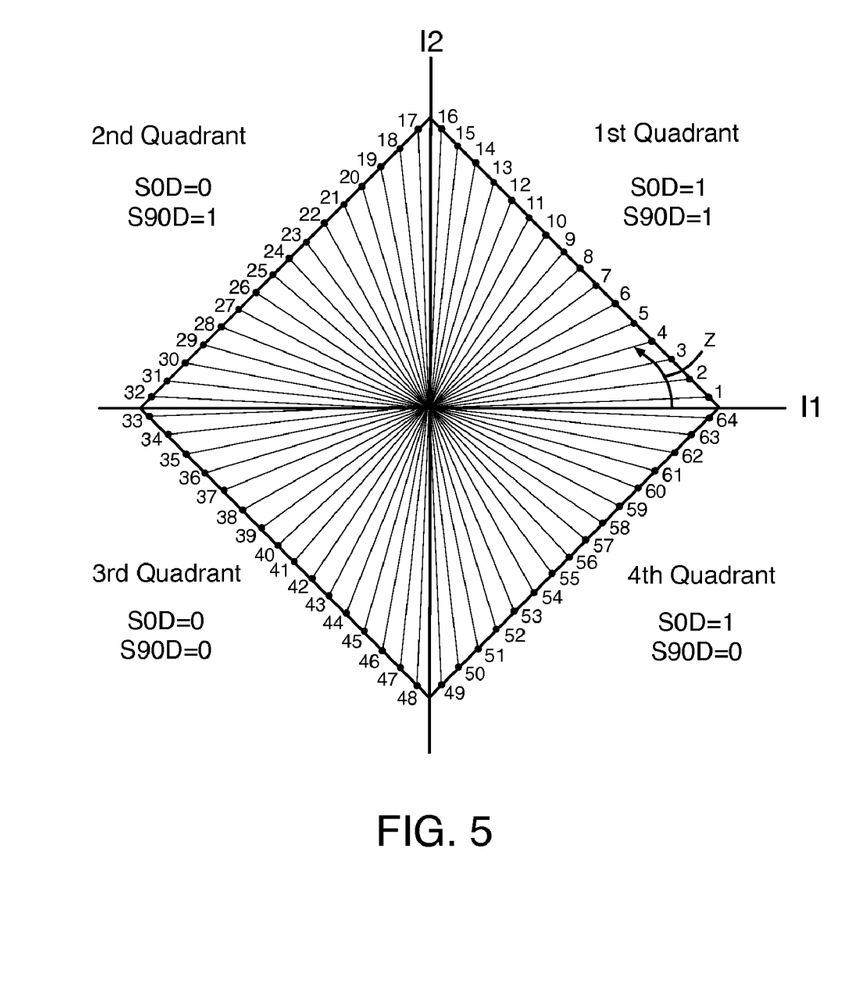
FIG. 5 is a graph that illustrates the different phase shifts that the phase interpolator of FIG. 1 can generate between $V_{OUT}$ and CLK0, according to an embodiment of the present invention.

FIG. 5 is a graph that illustrates the different phase shifts that phase interpolator 100 can generate between $V_{OUT}$ and CLK0, according to an embodiment of the present invention. The graph of FIG. 1 is plotted on a Cartesian coordinate system, where I1 is plotted on the horizontal axis, and I2 is plotted on the vertical axis.

The current I1 through variable current source 207 can be selected to be one of 16 different current values, and the current I2 through variable current source 208 can be selected to be one of 16 different current values. Because signals /IS0-/IS14 are the logical complements of signals IS0-IS14, respectively, each of the 16 current settings of I1 corresponds to only one of the 16 current settings of I2, as shown below in Table 2. Table 2 shows the 16 possible bit sequences of STEP[3:0] and the corresponding 16 possible bit sequences of IS0-IS14 and /IS0-/IS14 that determine the 16 different current settings of I1 and I2.

TABLE 2

| STEP[3:0] | IS0-IS14 (setting I1) | /IS0-/IS14 (setting I2) |
|---|---|---|
| 0000 | 000000000000000 | 111111111111111 |
| 0001 | 000000000000001 | 111111111111110 |
| 0010 | 000000000000011 | 111111111111100 |
| 0011 | 000000000000111 | 111111111111000 |
| 0100 | 000000000001111 | 111111111110000 |
| 0101 | 000000000011111 | 111111111100000 |
| 0110 | 000000000111111 | 111111111000000 |
| 0111 | 000000001111111 | 111111110000000 |
| 1000 | 000000011111111 | 111111100000000 |
| 1001 | 000000111111111 | 111111000000000 |
| 1010 | 000001111111111 | 111110000000000 |
| 1011 | 000011111111111 | 111100000000000 |
| 1100 | 000111111111111 | 111000000000000 |
| 1101 | 001111111111111 | 110000000000000 |
| 1110 | 011111111111111 | 100000000000000 |
| 1111 | 111111111111111 | 000000000000000 |

The 16 unique current settings of I1 and I2 generate 16 unique phase shifts between $V_{OUT}$ and CLK0. These 16 unique phase shifts between $V_{OUT}$ and CLK0 occur within each one of the four quadrants shown in the graph of FIG. 5.

When S0D is 1 (i.e., in a logic high state), and S90D is 1 (i.e., in a logic high state), SIN 1 is generated based on CLK0, SIN 2 is generated based on CLK180, COS 1 is generated based on CLK90, and COS 2 is generated based on CLK270. As a result, the 16 unique phase shifts between $V_{OUT}$ and CLK0 that are caused by the 16 unique current settings of I1 and I2 occur in the first quadrant of the graph shown in FIG. 5. When the phase shifts in $V_{OUT}$ relative to CLK0 occur in the first quadrant, the 16 different phase shifts in $V_{OUT}$ that are caused by the 16 different current settings of I1 and I2 occur between 0° and 90°.

When S0D is 0 (i.e., in a logic low state), and S90D is 1, SIN 1 is generated based on CLK180, SIN 2 is generated based on CLK0, COS 1 is generated based on CLK90, and COS 2 is generated based on CLK270. As a result, the 16 unique phase shifts between $V_{OUT}$ and CLK0 that are caused by the 16 unique current settings of I1 and I2 occur in the second quadrant of the graph shown in FIG. 5. When the phase shifts in $V_{OUT}$ relative to CLK0 occur in the second quadrant, the 16 different phase shifts in $V_{OUT}$ that are caused by the 16 different current settings of I1 and I2 occur between 90° and 180°.

When S0D is 0, and S90D is 0, SIN 1 is generated based on CLK180, SIN 2 is generated based on CLK0, COS 1 is generated based on CLK270, and COS 2 is generated based on CLK90. As a result, the 16 unique phase shifts between $V_{OUT}$ and CLK0 that are caused by the 16 unique current settings of I1 and I2 occur in the third quadrant of the graph shown in FIG. 5. When the phase shifts in $V_{OUT}$ relative to CLK0 occur in the third quadrant, the 16 different phase shifts in $V_{OUT}$ that are caused by the 16 different current settings of I1 and I2 occur between 180° and 270°.

When S0D is 1, and S90D is 0, SIN 1 is generated based on CLK0, SIN 2 is generated based on CLK180, COS 1 is generated based on CLK270, and COS 2 is generated based on CLK90. As a result, the 16 unique phase shifts between $V_{OUT}$ and CLK0 that are caused by the 16 unique current settings of I1 and I2 occur in the fourth quadrant of the graph shown in FIG. 5. When the phase shifts in $V_{OUT}$ relative to CLK0 occur in the fourth quadrant, the 16 different phase shifts in $V_{OUT}$ that are caused by the 16 different current settings of I1 and I2 occur between 270° and 360°.

The output voltage signal $V_{OUT}$ of phase interpolator 100 in each of the four quadrants shown in FIG. 5 can be expressed using the formulas shown below in equations (4)-(7). As stated above, SIN 1=−SIN 2, and COS 1=−COS 2.

$$V_{OUT}=(I1 \times SIN\ 1)+(I2 \times COS\ 1): \text{in the first quadrant} \quad (4)$$

$$V_{OUT}=(I1 \times SIN\ 2)+(I2 \times COS\ 1): \text{in the second quadrant} \quad (5)$$

$$V_{OUT}=(I1 \times SIN\ 2)+(I2 \times COS\ 2): \text{in the third quadrant} \quad (6)$$

$$V_{OUT}=(I1 \times SIN\ 1)+(I2 \times COS\ 2): \text{in the fourth quadrant} \quad (7)$$

Using switches 221-224 to switch CLK0 and CLK180 between filters 203-204 and using switches 225-228 to switch CLK90 and CLK270 between filters 205-206 allows phase interpolator 100 to generate 16 different phase shifts for $V_{OUT}$ in each of the four quadrants for a total of 64 unique phase shifts in $V_{OUT}$. Phase interpolator 100 can generate the 64 different phase shifts in $V_{OUT}$ using switches 221-228, two differential pairs of transistors 211/212 and 213/214, and two variable current sources 207-208.

In FIG. 5, each point along the lines in the four quadrants represents a different one of the 64 phase shifts between $V_{OUT}$ and CLK0. Each of the 64 phase shifts between $V_{OUT}$ and CLK0 is also referred to as a step. The 64 phase shifts are numbered 1-64 in FIG. 5. Each phase offset between $V_{OUT}$ and CLK0 is represented by the angle between 0° and the coordinate generated by one of the points 1-64 shown in FIG. 5. For example, angle Z in FIG. 5 is the phase offset between $V_{OUT}$ and CLK0 generated by step 4. Varying the logic states of signals S0D, S0DB, S90D, S90DB, and STEP[3:0] generates 64 phase offsets between $V_{OUT}$ and CLK0 in the four quadrants. 16 phase offsets are generated in each quadrant.

By changing the logic states of signals S0D, S90D, and STEP[3:0] to each possible combination of the digital values of these signals, 64 unique phase offsets can be generated between output voltage signal $V_{OUT}$ and input clock signal CLK0. Table 3 below summarizes the 64 steps and the corresponding values of signals STEP[3:0], S0D, and S90D that generate each of these steps. Each incremental step from 1-64 generates a larger phase offset between $V_{OUT}$ and CLK0.

TABLE 3

| 1st Quadrant S0D = 1 S90D = 1 | | 2nd Quadrant S0D = 0 S90D = 1 | | 3rd Quadrant S0D = 0 S90D = 0 | | 4th Quadrant S0D = 1 S90D = 0 | |
|---|---|---|---|---|---|---|---|
| STEP[3:0] | Step No. | STEP[3:0] | Step No. | STEP[3:0] | Step No. | STEP[3:0] | Step No. |
| 15 | 1 | 0 | 17 | 15 | 33 | 0 | 49 |
| 14 | 2 | 1 | 18 | 14 | 34 | 1 | 50 |
| 13 | 3 | 2 | 19 | 13 | 35 | 2 | 51 |
| 12 | 4 | 3 | 20 | 12 | 36 | 3 | 52 |
| 11 | 5 | 4 | 21 | 11 | 37 | 4 | 53 |
| 10 | 6 | 5 | 22 | 10 | 38 | 5 | 54 |
| 9 | 7 | 6 | 23 | 9 | 39 | 6 | 55 |
| 8 | 8 | 7 | 24 | 8 | 40 | 7 | 56 |
| 7 | 9 | 8 | 25 | 7 | 41 | 8 | 57 |
| 6 | 10 | 9 | 26 | 6 | 42 | 9 | 58 |
| 5 | 11 | 10 | 27 | 5 | 43 | 10 | 59 |
| 4 | 12 | 11 | 28 | 4 | 44 | 11 | 60 |
| 3 | 13 | 12 | 29 | 3 | 45 | 12 | 61 |
| 2 | 14 | 13 | 30 | 2 | 46 | 13 | 62 |
| 1 | 15 | 14 | 31 | 1 | 47 | 14 | 63 |
| 0 | 16 | 15 | 32 | 0 | 48 | 15 | 64 |

The formula shown in equation (8) below represents the waveform of the sinusoidal output voltage signal $V_{OUT}$ of phase interpolator 100.

$$V_{OUT}=(a \times \sin(\omega t))+(b \times \cos(\omega t))=c \times \sin(\omega t+x) \quad (8)$$

In equation (8), a is the coordinate along the horizontal axis, b is the coordinate along the vertical axis, $c=\sqrt{a^2+b^2}$, t is the time, and ω equals 2πf, where f is the frequency of $V_{OUT}$. Also, in equation (8), x is the phase offset (also referred to herein as phase shift) between CLK0 and $V_{OUT}$. The angle x of the phase shift between CLK0 and $V_{OUT}$ can also be represented using equation (9) as shown below.

$$x=\arctan(b/a) \quad (9)$$

Arctangent (arctan) is a nonlinear function. As a result, if each of the current sources 421-435 generates the same amount of current in each of the variable current sources 207-208, the difference between the angles of each adjacent pair of the 64 phase shifts between CLK0 and $V_{OUT}$ generated by phase interpolator 100 are not equal to each other. For example, an ideal step size for a 6 Gbps output signal $V_{OUT}$ may be 5.2 picoseconds (ps). However, the step size may vary between 4.7 ps and 6.1 ps in an integrated circuit having a typical process.

The output voltage signal $V_{OUT}$ of phase interpolator 100 can be converted to a square wave clock signal that is used to sample input data. The period of the sampling clock signal generated from $V_{OUT}$ can be, for example, twice as long as the bit period of each bit in the input data signal. In this example, phase interpolator 100 can generate 32 unique phase shifts in the sampling clock signal within the bit period of each bit in the input data signal.

In some implementations, a clock signal generated from output voltage signal $V_{OUT}$ can sample data at a high data rate (e.g., 8.5-10 Gbps). Phase interpolator 100 can be used in any high-speed serial interface, such as a clock data recovery circuit, decision feedback equalizer circuit, an eye monitor circuit, or a dynamic phase alignment circuit.

Figure 6:
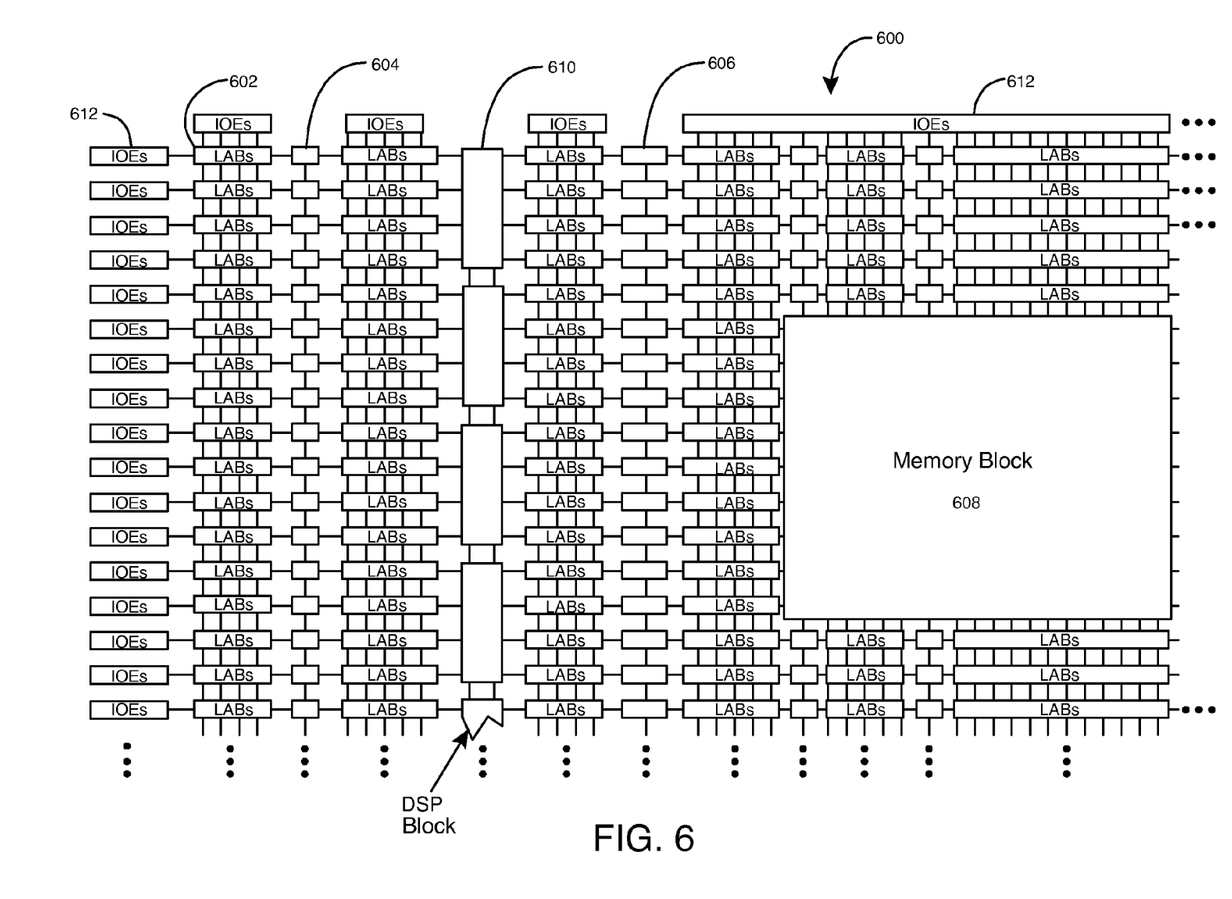
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) blocks 610 that can implement, for example, multipliers with add or subtract features. Input/output elements (IOEs) 612 located, in this example, around the periphery of the chip, support numerous single-ended and differential input/output standards. IOEs 612 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 600 is described herein for illustrative purposes only and that the present invention can be implemented in many different types of PLDs, FPGAs, and ASICs.

Figure 7:
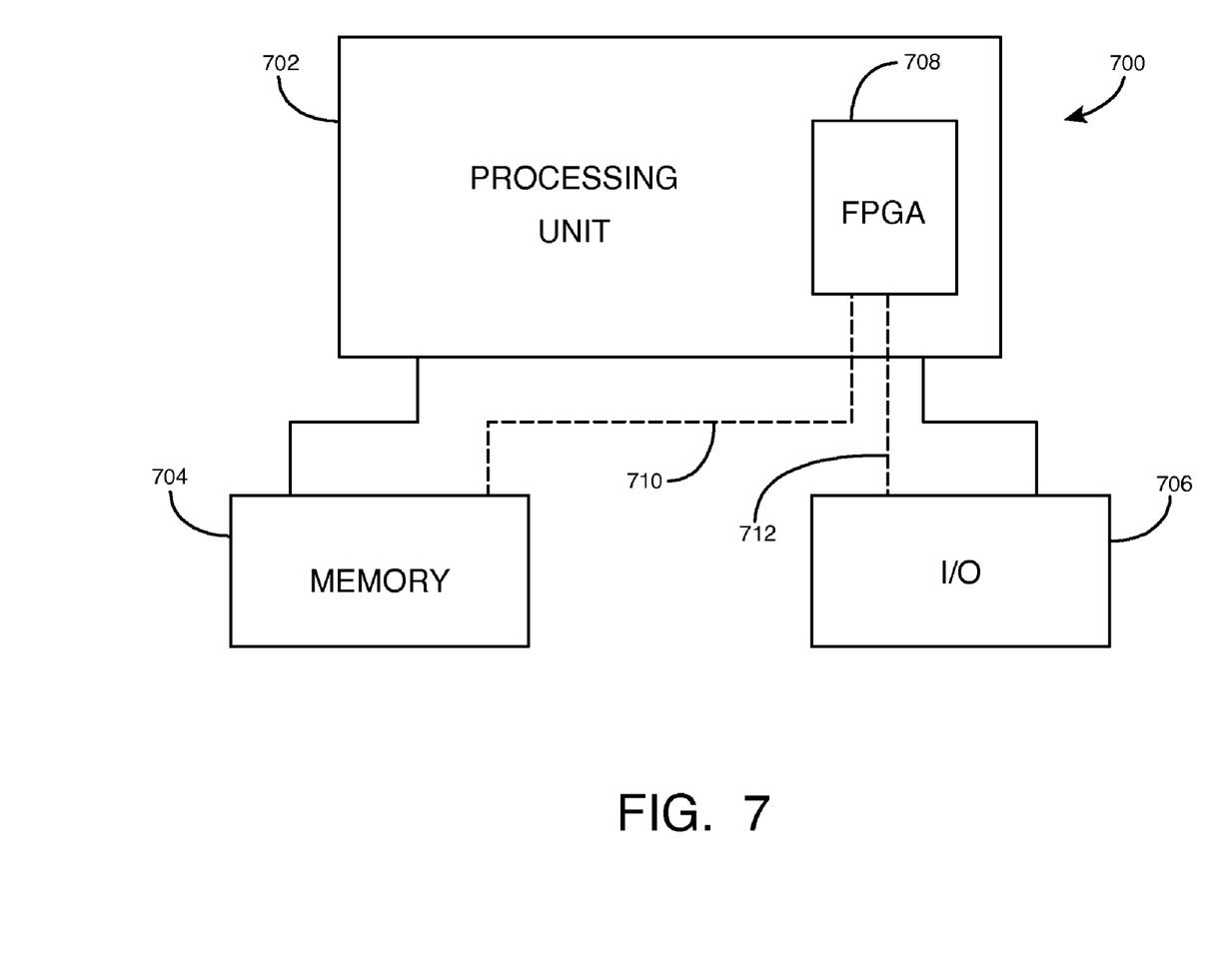
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A phase interpolator circuit comprising:
a first low pass filter circuit that generates a first varying signal, wherein the first low pass filter circuit comprises first capacitors coupled to first switches, wherein conductive states of the first switches are controlled by first control signals to set a bandwidth of the first low pass filter;
a second low pass filter circuit that generates a second varying signal, wherein the second low pass filter circuit comprises second capacitors coupled to second switches, wherein conductive states of the second switches are controlled by second control signals to set a bandwidth of the second low pass filter; and
a multiplier circuit having a first input coupled to the first low pass filter circuit and a second input coupled to the second low pass filter circuit, wherein the multiplier circuit generates a third varying signal in response to the first and the second varying signals.

2. The phase interpolator circuit defined in claim 1 wherein the phase interpolator circuit is fabricated on a field programmable gate array integrated circuit.

3. A phase interpolator circuit comprising:
a first low pass filter circuit that generates a first varying signal, wherein the first low pass filter circuit comprises a first resistor coupled between an input of the first low pass filter circuit and an output of the first low pass filter circuit, a second resistor coupled between the output of the first low pass filter circuit and a supply voltage, and a third resistor coupled between the output of the first low pass filter circuit and ground;
a second low pass filter circuit that generates a second varying signal, wherein the second low pass filter circuit comprises a fourth resistor coupled between an input of the second low pass filter circuit and an output of the second low pass filter circuit, a fifth resistor coupled between the output of the second low pass filter circuit and the supply voltage, and a sixth resistor coupled between the output of the second low pass filter circuit and ground; and
a multiplier circuit having a first input coupled to the first low pass filter circuit and a second input coupled to the second low pass filter circuit, wherein the multiplier circuit generates a third varying signal in response to the first and the second varying signals.

4. A phase interpolator circuit comprising:
a first low pass filter circuit that generates a first varying signal;
a second low pass filter circuit that generates a second varying signal;
a multiplier circuit having a first input coupled to the first low pass filter circuit and a second input coupled to the second low pass filter circuit, wherein the multiplier circuit generates a third varying signal in response to the first and the second varying signals;
a first switch circuit that transmits a first clock signal to an input of the first low pass filter circuit when the first switch circuit is closed;
a second switch circuit that transmits a second clock signal to an input of the second low pass filter circuit when the second switch circuit is closed;
a third switch circuit that transmits the first clock signal to the input of the second low pass filter circuit when the third switch circuit is closed; and
a fourth switch circuit that transmits the second clock signal to the input of the first low pass filter circuit when the fourth switch circuit is closed.

5. A phase interpolator circuit comprising:
a first low pass filter circuit that generates a first varying signal;
a second low pass filter circuit that generates a second varying signal;
a third low pass filter circuit that generates a third varying signal;

a fourth low pass filter circuit that generates a fourth varying signal; and a multiplier circuit having a first input coupled to the first low pass filter circuit and a second input coupled to the second low pass filter circuit, wherein the multiplier circuit has a third input coupled to the third low pass filter circuit and a fourth input coupled to the fourth low pass filter circuit, and wherein the multiplier circuit generates a fifth varying signal in response to the first, the second, the third, and the fourth varying signals.

6. The phase interpolator circuit defined in claim 5:

wherein the first low pass filter circuit comprises first capacitors coupled to first switches, wherein conductive states of the first switches are controlled by first control signals to a set a bandwidth of the first low pass filter circuit, wherein the second low pass filter circuit comprises second capacitors coupled to second switches, wherein conductive states of the second switches are controlled by second control signals to set a bandwidth of the second low pass filter circuit, wherein the third low pass filter circuit comprises third capacitors coupled to third switches, wherein conductive states of the third switches are controlled by third control signals to set a bandwidth of the third low pass filter circuit, and wherein the fourth low pass filter circuit comprises fourth capacitors coupled to fourth switches, wherein conductive states of the fourth switches are controlled by fourth control signals to set a bandwidth of the fourth low pass filter circuit.

7. The phase interpolator circuit defined in claim 6:

wherein the first low pass filter circuit further comprises a first resistor divider, wherein the second low pass filter circuit further comprises a second resistor divider, wherein the third low pass filter circuit further comprises a third resistor divider, and wherein the fourth low pass filter circuit further comprises a fourth resistor divider.

8. The phase interpolator circuit defined in claim 5 further comprising:

a first switch circuit that transmits a first clock signal to an input of the first low pass filter circuit when the first switch circuit is closed;

a second switch circuit that transmits a second clock signal to an input of the second low pass filter circuit when the second switch circuit is closed;

a third switch circuit that transmits the first clock signal to the input of the second low pass filter circuit when the third switch circuit is closed;

a fourth switch circuit that transmits the second clock signal to the input of the first low pass filter circuit when the fourth switch circuit is closed;

a fifth switch circuit that transmits a third clock signal to an input of the third low pass filter circuit when the fifth switch circuit is closed;

a sixth switch circuit that transmits a fourth clock signal to an input of the fourth low pass filter circuit when the sixth switch circuit is closed;

a seventh switch circuit that transmits the third clock signal to the input of the fourth low pass filter circuit when the seventh switch circuit is closed; and an eighth switch circuit that transmits the fourth clock signal to the input of the third low pass filter circuit when the eighth switch circuit is closed.

9. A phase interpolator circuit comprising:

a first low pass filter circuit comprising a first variable capacitance, wherein the first low pass filter circuit filters a clock signal to generate a first varying signal;

a second low pass filter circuit comprising a second variable capacitance, wherein the second low pass filter circuit filters a clock signal to generate a second varying signal; and a multiplier circuit having a first input coupled to the first low pass filter circuit and a second input coupled to the second low pass filter circuit, wherein the multiplier circuit generates a third varying signal in response to the first and the second varying signals, and wherein the phase interpolator circuit generates a phase shift in the third varying signal.

10. The phase interpolator circuit defined in claim 9:

wherein the first low pass filter circuit increases a common mode voltage of a clock signal to generate the first varying signal, and wherein the second low pass filter circuit increases a common mode voltage of a clock signal to generate the second varying signal.

11. The phase interpolator circuit defined in claim 9 further comprising:

a third low pass filter circuit comprising a third variable capacitance and that generates a fourth varying signal based on a clock signal; and a fourth low pass filter circuit comprising a fourth variable capacitance and that generates a fifth varying signal based on a clock signal, wherein the multiplier circuit has a third input coupled to the third low pass filter circuit and a fourth input coupled to the fourth low pass filter circuit, and wherein the multiplier circuit generates the third varying signal in response to the first, the second, the fourth, and the fifth varying signals.

12. The phase interpolator circuit defined in claim 11:

wherein the first low pass filter circuit comprises first capacitors and first switches, and conductive states of the first switches are varied to change the first variable capacitance, wherein the second low pass filter circuit comprises second capacitors and second switches, and conductive states of the second switches are varied to change the second variable capacitance, wherein the third low pass filter circuit comprises third capacitors and third switches, and conductive states of the third switches are varied to change the third variable capacitance, wherein the fourth low pass filter circuit comprises fourth capacitors and fourth switches, and conductive states of the fourth switches are varied to change the fourth variable capacitance.

13. The phase interpolator circuit defined in claim 11 wherein the first low pass filter circuit further comprises a first resistor divider, wherein the second low pass filter circuit further comprises a second resistor divider, wherein the third low pass filter circuit further comprises a third resistor divider, and wherein the fourth low pass filter circuit further comprises a fourth resistor divider.

14. The phase interpolator circuit defined in claim 11:

wherein the first low pass filter circuit increases a common mode voltage of a clock signal to generate the first varying signal, wherein the second low pass filter circuit increases a common mode voltage of a clock signal to generate the second varying signal, wherein the third low pass filter circuit increases a common mode voltage of a clock signal to generate the fourth varying signal, wherein the fourth low pass filter circuit increases a common mode voltage of a clock signal to generate the fifth varying signal.

15. The phase interpolator circuit defined in claim 12:

wherein each of the first capacitors is coupled in series with one of the first switches, wherein each of the second capacitors is coupled in series with one of the second switches, wherein each of the third capacitors is coupled in series with one of the third switches, and wherein each of the fourth capacitors is coupled in series with one of the fourth switches.

16. The phase interpolator circuit defined in claim 9 wherein the phase interpolator circuit generates 64 phase shifts in the third varying signal between 0 degrees and 360 degrees.

17. A method for shifting a phase of a signal using a phase interpolator, the method comprising:

increasing a common mode voltage of a clock signal to generate a first varying signal;

changing a first variable capacitance to adjust a frequency range of the first varying signal;

increasing a common mode voltage of a clock signal to generate a second varying signal;

changing a second variable capacitance to adjust a frequency range of the second varying signal; and generating a third varying signal based on the first and the second varying signals, wherein the third varying signal has a phase shift relative to an input clock signal.

18. The method defined in claim 17 wherein increasing a common mode voltage of a clock signal to generate a first varying signal further comprises low pass filtering a clock signal to generate the first varying signal, and wherein increasing a common mode voltage of a clock signal to generate a second varying signal further comprises low pass filtering a clock signal to generate the second varying signal.

19. The method defined in claim 17 further comprising:

increasing a common mode voltage of a clock signal to generate a fourth varying signal;

changing a third variable capacitance to adjust a frequency range of the fourth varying signal;

increasing a common mode voltage of a clock signal to generate a fifth varying signal; and changing a fourth variable capacitance to adjust a frequency range of the fifth varying signal, wherein generating a third varying signal based on the first and the second varying signals further comprises generating the third varying signal based on the first, the second, the fourth, and the fifth varying signals.

* * * * *